(12) United States Patent
Williams et al.

(10) Patent No.: US 8,450,711 B2
(45) Date of Patent: May 28, 2013

(54) SEMICONDUCTOR MEMRISTOR DEVICES

(75) Inventors: R. Stanley Williams, Portola Valley, CA (US); Jianhua Yang, Palo Alto, CA (US); Duncan Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 61 days.

(21) Appl. No.: 13/142,582

(22) PCT Filed: Jan. 26, 2009

(86) PCT No.: PCT/US2009/000518
§ 371 (c)(1),
(2), (4) Date: Jun. 28, 2011

(87) PCT Pub. No.: WO2010/085227
PCT Pub. Date: Jul. 29, 2010

(65) Prior Publication Data
US 2011/0266513 A1    Nov. 3, 2011

(51) Int. Cl.
*H01L 29/02* (2006.01)
(52) U.S. Cl.
USPC ...... 257/2; 257/3; 257/4; 257/5; 257/E29.002
(58) Field of Classification Search
USPC .... 257/2–5, E29.002; 438/102–104; 365/163
See application file for complete search history.

(56) References Cited

U.S. PATENT DOCUMENTS

| | | | |
|---|---|---|---|
| 3,843,949 A | 10/1974 | Plough et al. | |
| 3,937,989 A | 2/1976 | Meijer | |
| 3,972,059 A | 7/1976 | Distefano | |
| 6,127,914 A | 10/2000 | Sasaki | |
| 6,780,683 B2 | 8/2004 | Johnson | |
| 7,220,983 B2 | 5/2007 | Lung | |
| 2003/0143790 A1 | 7/2003 | Wu | |
| 2003/0173612 A1 | 9/2003 | Krieger | |
| 2005/0006640 A1 | 1/2005 | Jackson | |
| 2006/0043595 A1 | 3/2006 | Aratani et al. | |
| 2007/0221953 A1 | 9/2007 | Sakamoto | |
| 2008/0079029 A1* | 4/2008 | Williams | 257/213 |
| 2008/0090337 A1 | 4/2008 | Williams | |
| 2008/0239797 A1 | 10/2008 | Tsukamoto et al. | |
| 2008/0265235 A1 | 10/2008 | Kamigaichi et al. | |
| 2011/0266510 A1 | 11/2011 | Quitoriano et al. | |

OTHER PUBLICATIONS

"Nonvolatile" Merriam-Webster Online Dictionary. 2012, http://www.merriam-webster.com (Nov. 4, 2012).
Driscoll, Tom, et al. "Phase-transition driven memristive system." Applied Physics Letters 95.4 (2009): 043503-043503.
PCT International Search Report, Application No. PCT/US2009/000516, Report dated Aug. 28, 2009.
PCT International Search Report, Application No. PCT/US2009/000518, Report dated Jun. 29, 2009.
PCT International Search Report, Application No. PCT/US2009/050277, Report dated Apr. 12, 2010.

* cited by examiner

*Primary Examiner* — Jami M Valentine

(57) ABSTRACT

Various embodiments of the present invention are directed to electronic devices, which combine reconfigurable diode rectifying states with nonvolatile memristive switching. In one aspect, an electronic device (210,230,240) comprises an active region (212) sandwiched between a first electrode (104) and a second electrode (106). The active region includes two or more semiconductor layers and at least one dopant that is capable of being selectively positioned within the active region to control the flow of charge carriers through the device.

17 Claims, 13 Drawing Sheets

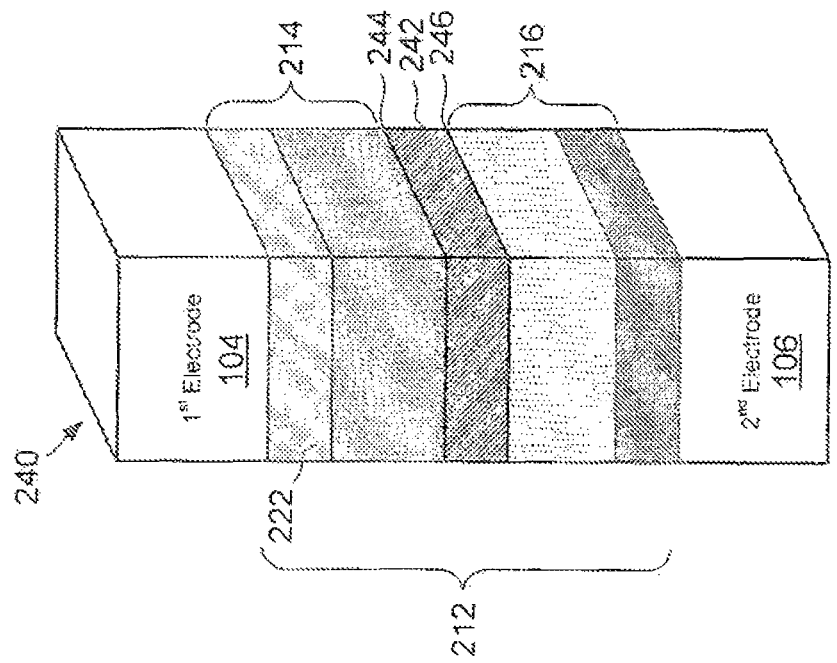
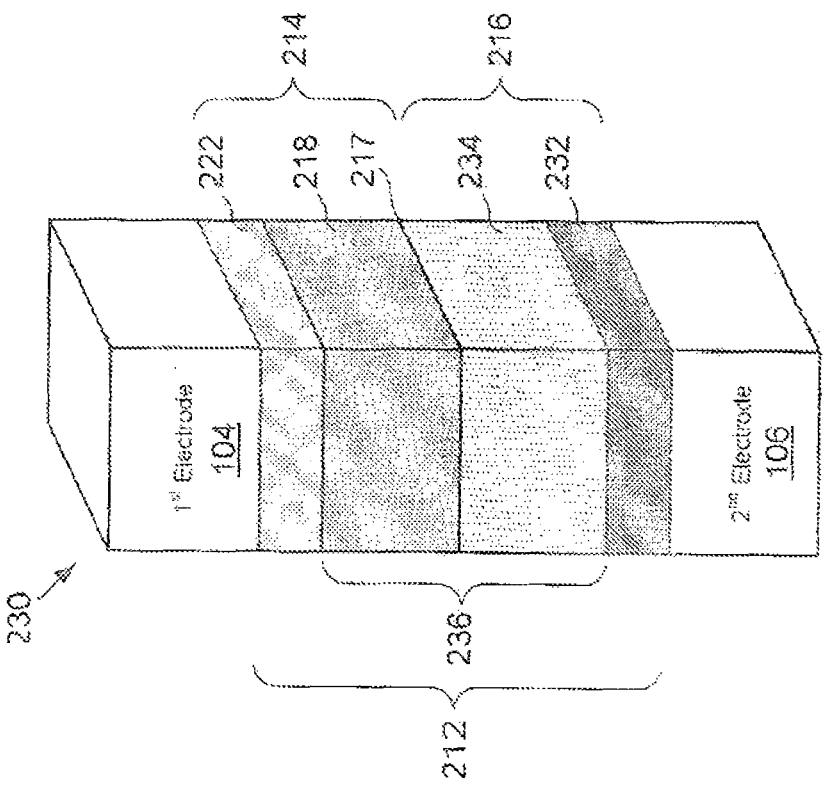

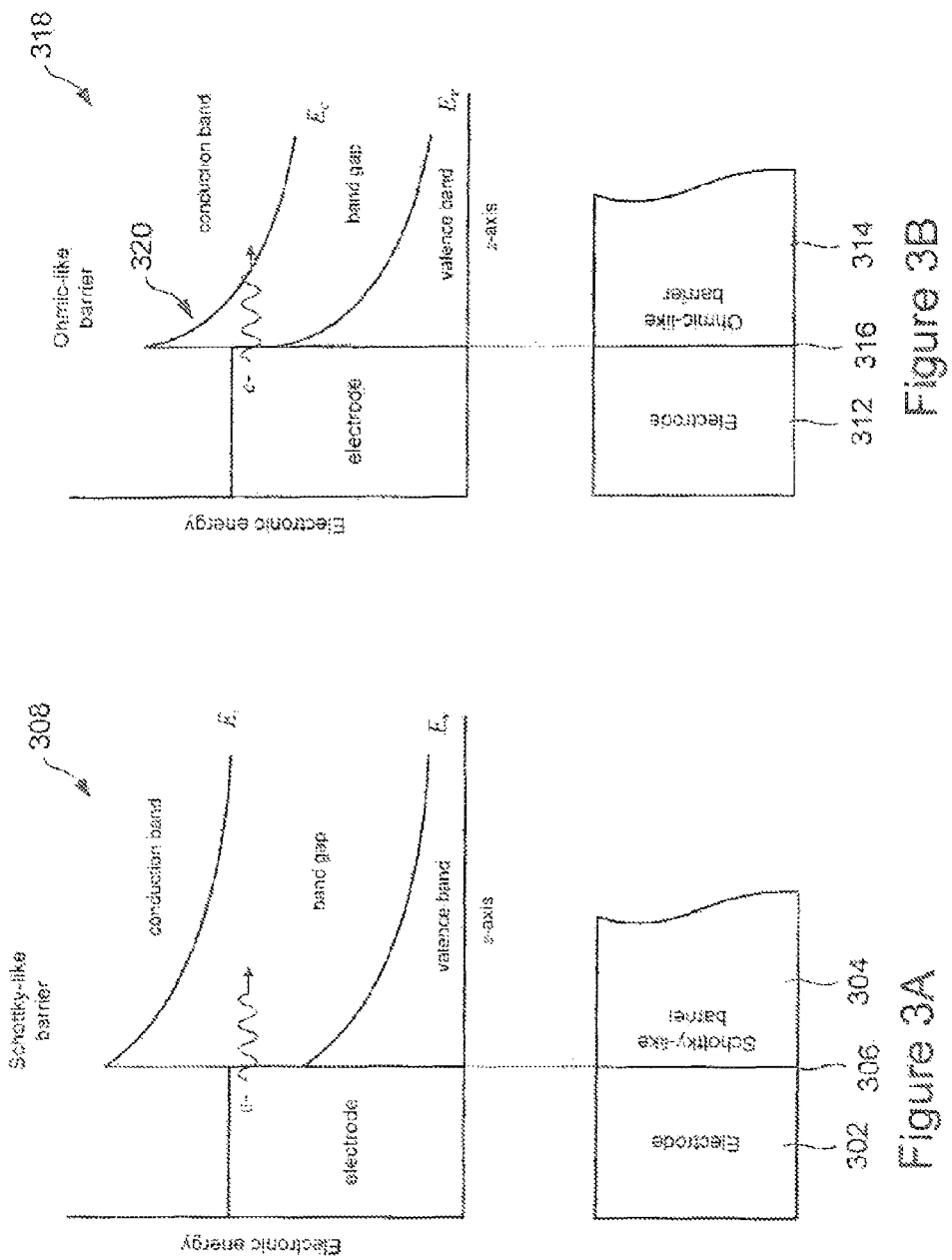

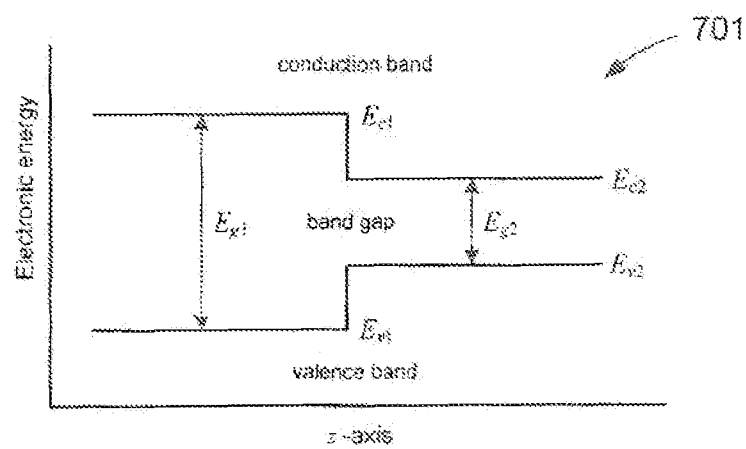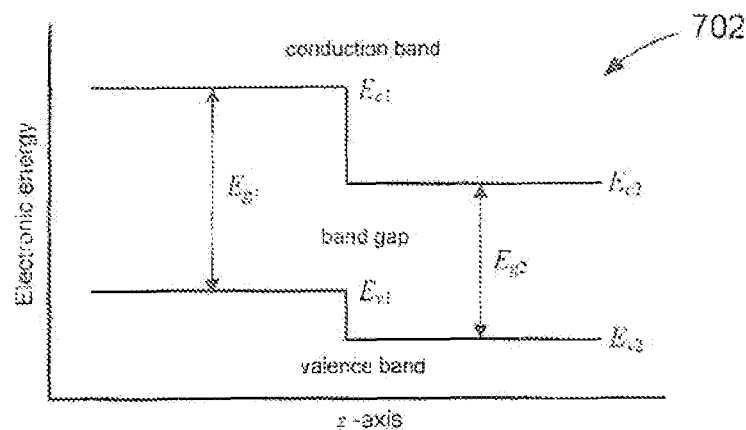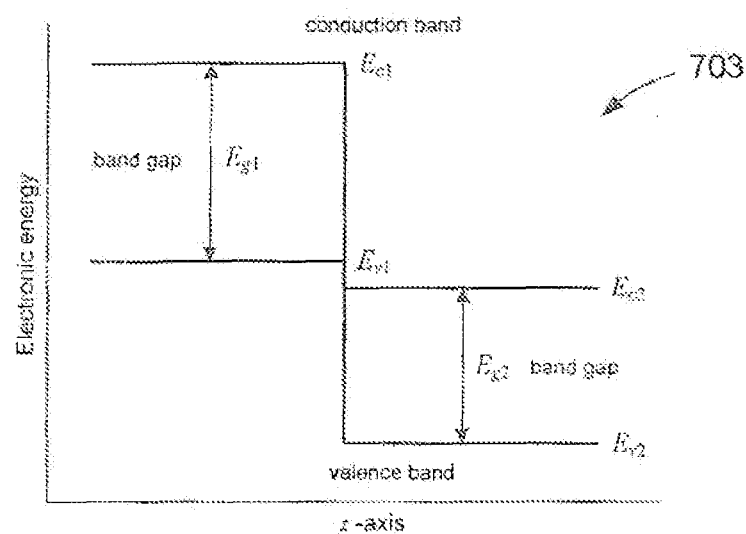
Figure 7

SEMICONDUCTOR MEMRISTOR DEVICES

TECHNICAL FIELD

Embodiments of the present invention are related to nanoscale memristor devices.

BACKGROUND

Significant research and development efforts are currently directed towards designing and manufacturing nanoscale electronic devices, such as nanoscale memories. Nanoscale electronics promises significant advances, including significantly reduced features sizes and the potential for self-assembly and for other relatively inexpensive, non-photolithography-based fabrication methods. However, the design and manufacture of nanoscale electronic devices present many new problems compared with the current state-of-the-art.

Studies of switching in nanometer-scale transition-metal oxide devices have previously reported that these devices could be reversibly switched and had an "on-to-off" conductance ratio of ~$10^3$. These devices have been used to construct crossbar circuits and provide a promising route for the creation of ultra-high density nonvolatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of the devices that are presently fabricated.

BRIEF DESCRIPTION OF THE DRAWINGS

FIGS. 2A-2D show active region configurations for memristor devices configured in accordance with embodiments of the present invention.

FIGS. 3A-3B show electronic band diagrams associated with Schottky-like and Ohmic-like barriers at electrode/active region interfaces in accordance with embodiments of the present invention.

FIG. 7 shows band diagrams associated with different types of heterojunctions formed in an active region in accordance with embodiments of the present invention.

DETAILED DESCRIPTION

Various embodiments of the present invention are directed to nanoscale electronic devices that provide nonvolatile memristive switching. A memristor device configured in accordance with embodiments of the present invention is composed of an active region sandwiched between two electrodes. In certain embodiments, the memristor devices are diodes that can be switched to operate as a forward rectifier, a reverse rectifier, a shunted rectifier, and a head-to-head rectifier by applying an electrical field of an appropriate magnitude and polarity across the active region to form Ohmic- and Schottky-like barriers at the active region/electrode interfaces. In other embodiments, rather than relying on switching occurring near the active region/electrode interfaces, resistance state switching can also be performed away from the electrodes within the active region. The active region retains its resistance provided operating voltages applied to the memristor device do not exceed the magnitude of the electric field used to switch the resistance of the memristor device.

Embodiments of the present invention are directed to memristor devices with active regions composed of various semiconductor materials in combination with a variety of different electrode compositions. These combinations of materials provide a large engineering space from which memristor devices can be fabricated, are compatible with common CMOS devices, and can be fabricated using various semiconductor fabrication techniques.

The detailed description is organized as follows: A description of electronically actuated devices is provided in a first subsection. Various materials that can be used to fabricate the devices are provided in a second subsection. A description of switching the rectifying state of the devices is provided in a third subsection. An example implementation of memristor devices in crossbar arrays is provided in a fourth subsection.

I. An Electronically Actuated Device

Figure 1A:
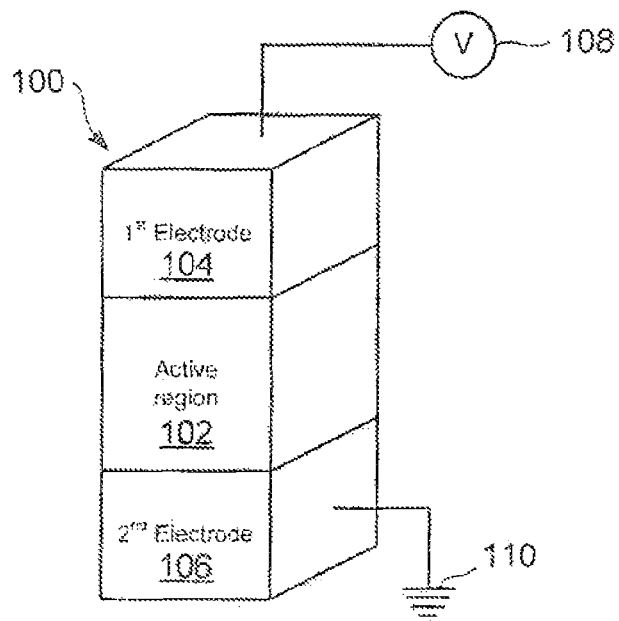
FIG. 1A shows a memristor device configured in accordance with embodiments of the present invention.

FIG. 1A shows a memristor device 100 configured in accordance with embodiments of the present invention. The device 100 is composed of three layers: an active region 102 sandwiched between a first electrode 104 and a second electrode 106. The first electrode 104 is connected to a voltage source 108 and the second electrode is connected to a ground 110. The junction is a diode and the active region 102 includes some dopants. Applying an electric field of an appropriate magnitude and polarity changes the position of the dopant within the active region. As a result, the junction can be operated as one of the four different types of rectifiers: a forward rectifier, a reverse rectifier, a head-to-head rectifier, and a shunted rectifier described in greater detail below with reference to FIGS. 4-6.

Figure 1B:
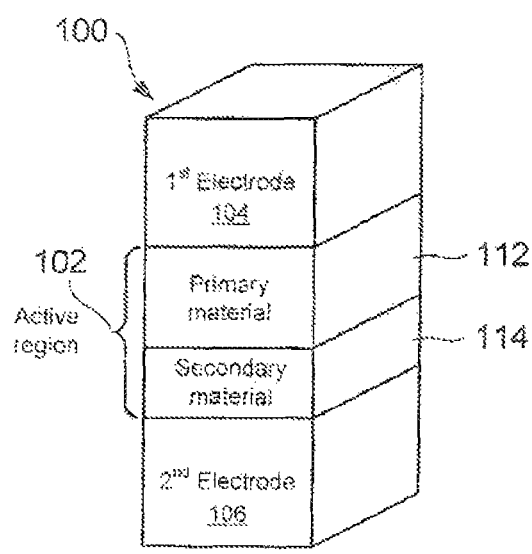
FIG. 1B shows primary and secondary active material layers comprising an active region of a memristor device configured in accordance with embodiments of the present invention.

FIG. 1B shows the active region 102 composed of a primary active region or layer 112 and a secondary active region or layer 114 in accordance with embodiments of the present invention. The primary active region 112 comprises a material that is electronically semiconducting or nominally electronically insulating and can also be a weak ionic conductor. The primary active material is capable of transporting the dopants that control the flow of charge carriers or current through the device 100. On the other hand, the material comprising the secondary active layer 114 typically comprises a film within the active region that is a source of dopants for the primary active material. These dopants may be impurity atoms that acts as electron donors or electron acceptors for the primary active material. Alternatively, the dopants can be anion vacancies or cation interstitials, which in the primary active material are charged and therefore are also electron donors for the lattice of the active region 102. It is also possible to drive the anions into the primary active material, which become electron acceptors or hole donors.

The basic mode of operation is to apply an electrical field of an appropriate magnitude and polarity across the active region 102. When the magnitude and polarity of the electrical field, also called a "drift field," exceeds a threshold, the dopants become mobile in the primary active material, and the dopants can drift into or out of the primary active material via ionic transport from the secondary active material. The ionic species are specifically chosen from those that act as electrical dopants for the primary active material, and thereby change the resistance of the primary active material. For example, applying a drift field that introduces dopants from the secondary active material into the primary active material lowers the resistance of the primary active material, while applying a drift field that drives dopants from the primary active material into the secondary active material increases the resistance of the primary active material. In addition, the primary active material and the dopants are chosen such that the drift of the dopants into or out of the primary active material is possible but not too facile that dopants can diffuse into or out of the primary active material when no voltage is applied. Some diffusion resistance is required to ensure that the active region 102 remains in a particular rectifying state for a reasonable period of time, perhaps for many years at the operation temperature. This ensures that the active region 102 is nonvolatile because the active region 102 retains its rectifying state even after the drift field has been removed. Applying a drift field with a large enough magnitude causes both electron current and dopants to drift, whereas applying operating voltages with lower relative voltage magnitudes than the drift field causes negligible dopant drift enabling the device to retain its rectifying state during operation.

The device 100 is a memristor because the resistance changes in a nonvolatile fashion depending on the magnitude and polarity of an electric field applied in the device 100. Memristance is a nonvolatile, charge-dependent resistance denoted by M(q). The term "memristor" is short for "memory resistor." Memristors are a class of passive circuit elements that maintain a functional relationship between the time integrals of current and voltage, or charge and flux, respectively. This results in resistance varying according to the device's memristance function. Specifically engineered memristors provide controllable resistance useful for switching current. The definition of the memristor is based solely on fundamental circuit variables, similar to the resistor, capacitor, and inductor. Unlike those more familiar elements, the necessarily nonlinear memristors may be described by any of a variety of time-varying functions. As a result, memristors do not belong to Linear Time-Independent circuit models. A linear time-independent memristor is simply a conventional resistor.

A memristor is a circuit element in which the 'magnetic flux' (defined as an integral of bias voltage over time) $\Phi$ between the terminals is a function of the amount of electric charge q that has passed through the device. Each memristor is characterized by its memristance function describing the charge-dependent rate of change of flux with charge as follows:

$$M(q) = \frac{d\Phi}{dq}$$

Based on Faraday's law of induction that magnetic flux $\Phi$ is the time integral of voltage, and charge q is the time integral of current, the memristance can be written as $$M(q) = \frac{V}{I}$$

Thus, as stated above, the memristance is simply nonvolatile charge-dependent resistance. When M(q) is constant, the memristance reduces to Ohm's Law R=V/I. When M(q) is not constant, the equation is not equivalent to Ohm's Law because q and M(q) can vary with time. Solving for voltage as a function of time gives:

$$V(t)=M[q(t)]I(t)$$

This equation reveals that memristance defines a linear relationship between current and voltage, as long as charge does not vary. However, nonzero current implies instantaneously varying charge. Alternating current may reveal the linear dependence in circuit operation by inducing a measurable voltage without net charge movement, as long as the maximum change in q does not cause change in M. Furthermore, the memristor is static when no current is applied. When I(t) and V(t) are 0, M(t) is constant. This is the essence of the memory effect.

The material comprising the primary active layer 112 can be single crystalline, poly-crystalline, nanocrystalline, nanoporous, or amorphous. The mobility of the dopants in nanocrystalline, nanoporous or amorphous materials, however, is much higher than in bulk crystalline material, since drift can occur through grain boundaries, pores or through local structural imperfections in a nanocrystalline, nanoporous, or amorphous material. Also, because the primary active material is relatively thin, the amount of time needed for dopants to drift into or out of the primary active material enables the primary active materials conductivity to be rapidly changed. For example, the time needed for a drift process varies as the square of the distance covered, so the time to drift one nanometer is one-millionth of the time to drift one micrometer.

The primary active layer 112 and the secondary active layer 114 are contacted on either side by conducting/semiconducting electrodes 104 and 106, or one of the electrodes can be composed of a semiconductor material and the other a conducting material. When the active region 102 is composed of a semiconductor material, the contact between a metallic electrode and the active region 102 depletes the active region 102 of free charge carriers. Thus, the net charge of the active region 102 depends on the identity of the dopant and is positive in the case of electron donors and negative in the case of electron acceptors.

The ability of the dopant to drift in and out of the primary active material may be improved if one of the interfaces connecting the active region 102 to a metallic or semiconductor electrode is non-covalently bonded. Such an interface may be composed of a material that does not form covalent bonds with the electrode, the primary active material, or both. This non-covalently bonded interface lowers the activation energy of the atomic rearrangements that are needed for drift of the dopants in the primary active material.

One potentially useful property of the primary active material is that it can be a weak ionic conductor. The definition of a weak ionic conductor depends on the application for which the device 100 is designed. The mobility $\mu_d$ and the diffusion constant D for a dopant in a lattice are related by the Einstein equation:

$$D = \mu_d kT$$

where k is Boltzmann's constant, and T is absolute temperature. Thus, if the mobility $\mu_d$ of a dopant in a lattice is high so is the diffusion constant D. In general, it is desired for the active region 102 of the device 100 to maintain a particular rectifying state for an amount of time that may range from a fraction of a second to years, depending on the application. Thus, it is desired that the diffusion constant D be low enough to ensure a desired level of stability, in order to avoid inadvertently turning the active region 102 from one rectifier to another rectifier via ionized dopant diffusion, rather than by intentionally setting the state of the active region 102 with an appropriate voltage. Therefore, a weakly ionic conductor is one in which the dopant mobility $\mu_d$ and the diffusion constant D are small enough to ensure the stability or non-volatility of the active region 102 for as long as necessary under the desired conditions. On the other hand, strongly ionic conductors would have relatively larger dopant mobilities and be unstable against diffusion. Note that this relation breaks down at high field and the mobility becomes exponentially dependent on the field.

II. Memristor Device Composition

Embodiments of the present invention relate to memristor devices having semiconductor-based active regions. In particular, the active region 102 can be composed of an elemental and/or compound semiconductor. Elemental semiconductors include silicon (Si), germanium (Ge), and diamond (C). Compound semiconductors include group IV compound semiconductors, III-V compound semiconductors, and II-VI compound semiconductors. Group IV compound semiconductors include combinations of elemental semiconductors, such as SiC and SiGe. III-V compound semiconductors are composed of column IIIa elements selected from boron (B), aluminum (Al), gallium (Ga), and indium (In) in combination with column Va elements selected from nitrogen (N), phosphorus (P), arsenic (As), and antimony (Sb). III-V compound semiconductors are classified according to the relative quantities of III and V elements. For example, binary compound semiconductors include, but are not limited to, BN, BP, BSb, AlP, AlAs, AlSb, GaAs, GaSb, GaP, InN, InP, InAs, and InSb. Ternary compound semiconductors include, but are not limited to, InGaP, AlInAs, GaAsN, AlGaN, AlGaP, InGaN, and InAsSb. Ternary compound semiconductors also include varying quantities of elements, such as $GaAs_yP_{1-y}$ and $In_yGa_{1-y}As$, where y ranges from greater than 0 to less than 1. Quaternary compound semiconductors include, but are not limited to, AlGaInP, InAlGaP, InGaAlP, AlInGaP, AlGaAsN, InAlAsN. Quaternary compound semiconductors also include varying quantities of elements, such as $In_xGa_{1-x}As_yP_{1-y}$, where both x and y independently range from greater than 0 to less than 1. Quinary compound semiconductors include, but are not limited to, GaInNAsSb and GaInAsSbP. II-VI semiconductors are composed of column IIb elements selected from zinc (Zn), cadmium (Cd), mercury (Hg) in combination with column VIa elements selected from oxygen (O), sulfur (S), selenium (Se), and tellurium (Te). For example, binary II-VI semiconductors include, but are not limited to, CdSe, CdS, CdTe, ZnSe, ZnS, and ZnO.

The active region 102 can be composed of other types of suitable compound semiconductors including II-VI ternary alloy semiconductors, such as CdZnTc, HgCdTe, and HgZnSel; IV-VI compound semiconductors, such as PbSe, PbS, SnS, and SnTe; and IV-VI ternary compound semiconductors, such as PbSnTe, $Tl_2SnTe_5$, $Tl_2GeTe_5$. The active region 102 can also be composed of a II-V compound semiconductor including, but not limited to, $Cd_3P_2$, $Cd_3As_2$, $Zn_3P_2$, $Zn_3As_2$, and $Zn_3Sb_2$, and other compound semiconductors, such as $Pb_2I$, $MoS_2$, GaSe, SnS, $Bi_2S_3$, PtSi, and $BiI_3$. Semiconductor compounds consisting of some noble metal elements with a high mobility at room temperature, such as Ag, Cu, Au are especially interesting. The active region 102 can also be composed of a semiconducting nitride or a semiconducting halide. For example, semiconducting nitrides include AlN, GaN, ScN, YN, LaN, rare earth nitrides, alloys of these compounds, and more complex mixed metal nitrides, and semiconducting halides include CuCI, CuBr, and AgCl.

In other embodiments, the active region 102 can also be a mixture of the different compound semiconductors described above.

The dopant in the secondary active layer 114 can be an anion vacancy or an aliovalent element. In other embodiments, the dopants in the secondary active layer 114 can be p-type impurities, which are atoms that introduce vacant electronic energy levels called "holes" to the electronic band gaps of the active region. These dopants are also called "electron acceptors." In still other embodiments, the dopants in the secondary active layer 114 can be n-type impurities, which are atoms that introduce filled electronic energy levels to the electronic band gap of the active region. These dopants are called "electron donors." For example, boron (B), Al, and Ga are p-type dopants that introduce vacant electronic energy levels near the valence band of the elemental semiconductors Si and Ge; and P, As, and Sb are n-type dopants that introduce filled electronic energy levels near the conduction band of the elemental semiconductors Si and Ge. In III-V compound semiconductors, column VI elements substitute for column V atoms in the III-V lattice and serve as n-type dopants, and column II elements substitute for column III atoms in the III-V lattice to form p-type dopants.

Figure 2B:
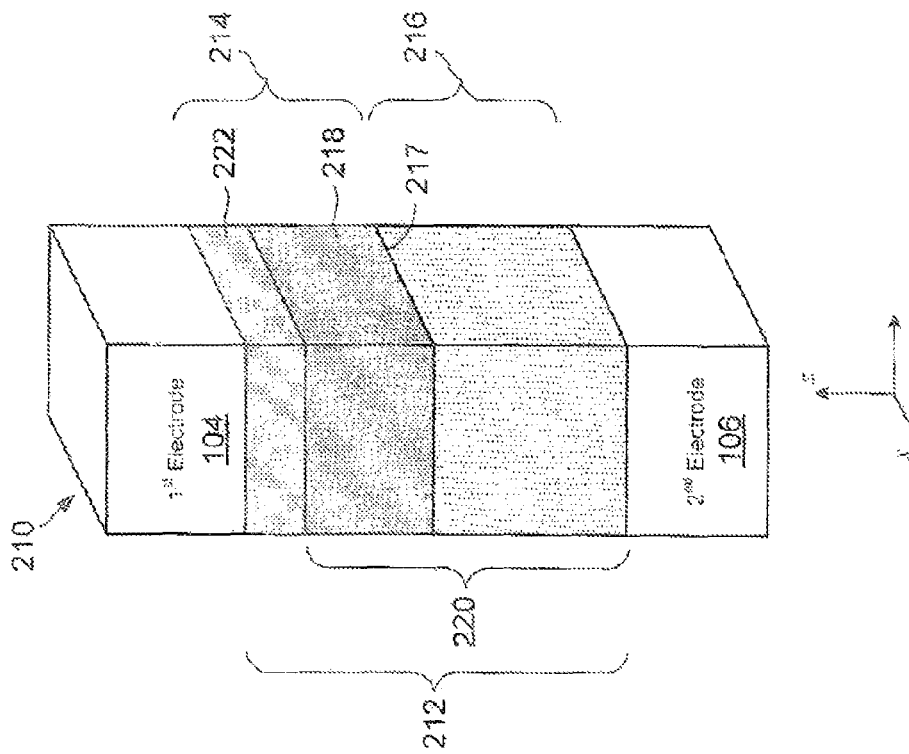
Figure 2A:
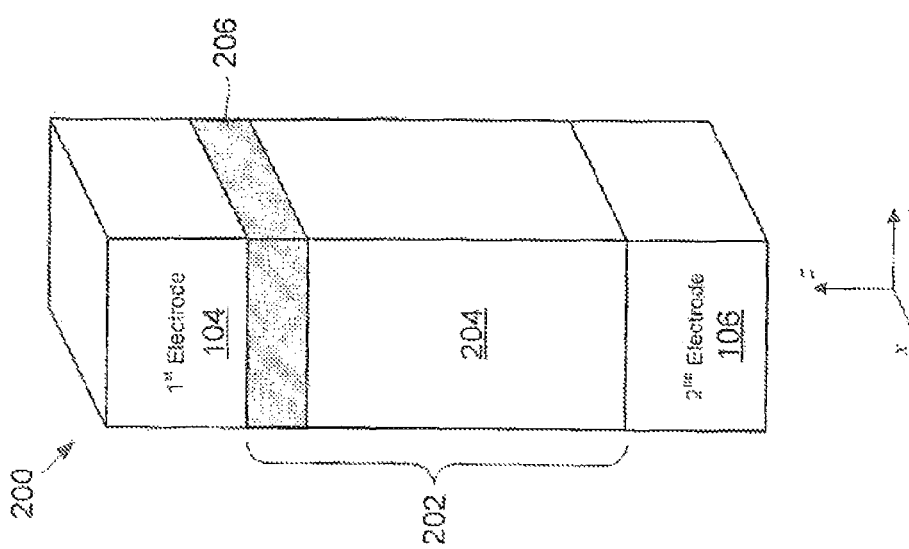

In certain embodiments, the active region can be composed of a single semiconductor material to form a memristor device. FIG. 2A shows a memristor device 200 configured with a homostructure active region in accordance with embodiments of the present invention. The device 200 includes an active region 202 composed of a single semiconductor material. An undoped region of the active region 202 forms the primary active layer 204. Dopants incorporated the active region 202 near the first electrode 104 form a secondary active layer 206, which provides a source and sink of dopants for configuring the device 210 as a rectifier.

In other embodiments, the active region can be a heterostructure composed of two semiconductor layers, each layer composed of a different semiconductor material forming a single heterojunction. FIG. 2B shows a memristor device 210 with a heterostructure active region configured with a single heterojunction and a single dopant in accordance with embodiments of the present invention. The device 210 includes an active region 212 composed of a first semiconductor layer 214 and a second semiconductor layer 216. The semiconductor layers 214 and 216 are composed of different semiconductor materials that create a heterojunction 217. An undoped portion 218 of the first semiconductor layer 214 and undoped second semiconductor layer 216 form the primary active layer 220. Dopants incorporated into a region of the first semiconductor layer 214 near the first electrode 104 form a secondary active layer 222, which provides a source and sink of dopants for configuring the rectifying states of the active region 212. In certain embodiments, the dopant and the materials comprising the semiconductor layers 214 and 216 can be selected so that the dopant serves as a charge carrier for the first semiconductor layer 214 alone. In other embodiments, the dopant can serve as a charge carrier for both semiconductor layers 214 and 216. In other embodiments, the active region 212 can be composed of two or more semiconductor layers forming a heterostructure active region with two or more heterojunctions and a single dopant.

In other embodiments, a heterostructure active region can be composed of two or more semiconductor layers, each layer composed of a different semiconductor material or no two adjacent layers composed of the same semiconductor material, and having two or more different types of dopants. FIG. 2C shows a memristor device 230 with a heterostructure active region configured with a single heterojunction and two types of dopants in accordance with embodiments of the present invention. The device 230 is nearly identical to the device 210 except a second type of dopant is incorporated into a region of the second semiconductor layer 216 near the second electrode 106 which forms a second secondary active layer 232. Undoped portion 218 of the first semiconductor layer 214 and undoped portion 234 of the second semiconductor layer 216 form a primary active layer 236. The first type of dopant can serve as a charge carrier for the first semiconductor layer 214, and the second type of dopant can serve as a charge carrier for the second semiconductor layer 216. In other embodiments, both dopants can be present in both semiconductor layers 214 and 216 and serve as charge carriers.

The FIG. 2D shows a memristor device 240 with a heterostructure active region configured with two heterojunctions and two types of dopants in accordance with embodiments of the present invention. The device 240 is nearly identical to the device 230 except the active region 212 includes a third semiconductor layer 242 sandwiched between the first semiconductor layer 214 and the second semiconductor layer 216. Heterojunctions 244 and 246 are formed at the interfaces between the three semiconductor layers 214, 242, and 216.

Embodiments of the present invention are limited to active regions with layers comprising one, two, or three different semiconductor materials and one or two different types of dopants. Embodiments of the present invention include heterostructure active regions with four, five, and six or more semiconductor layers, with no two adjacent layers composed of the same type of semiconductor material to form three, four, and five or more heterojunctions. Embodiments of the present invention also include three, four, and five or more different types of dopants.

In addition to the large variety of combinations of semiconductor materials and suitable dopants comprising the active region 102, the electrodes 104 and 106 can be composed of platinum (Pt), gold (Au), copper (Cu), tungsten (W), or any other suitable metal, metallic compound (e.g. some perovskites with or without dopants such as $BaTiO_3$ and $Ba_{1-x}La_xTiO_3$, $PrCaMnO_3$) or semiconductor. The electrodes 104 and 106 can also be composed of metallic oxides or nitrides, such as $RuO_2$, $IrO_2$, and TiN. The electrodes 104 and 106 can also be composed of any suitable combination of these materials. For example, in certain embodiments, the first electrode 104 can be composed of Pt, and the second electrode 106 can be composed Au. In other embodiments, the first electrode 104 can be composed of Cu, and the second electrode 106 can be composed of $IrO_2$. In still other embodiments, the first electrode 104 can be composed of a suitable semiconductor, and the second electrode 106 can be composed of Pt.

III. Nonvolatile Switching of the Memristor Device

The resistance of the memristor device 100 configured as described above in subsection II can be controlled as follows. In certain embodiments, switching the resistance of the memristor device 100 can be controlled at the active region/electrode interfaces in a switching process called "interface switching" described below in subsection A. In other embodiments, the electronic barriers at the interfaces are relatively small and contribute little to the device resistance, and resistance switching is performed within the bulk materials of the active region described below in subsection B.

A. Interface Switching

A memristor device 100 configured as described above in subsection II can also be operated as forward rectifier, a reverse rectifier, a shunted rectifier, or a head-to-head rectifier as described below by applying an electrical field of an appropriate magnitude and polarity across the active region 102. Nonvolatile switching between different types of rectifiers is performed by positioning a dopant within the active region 102 to form Ohmic and Schottky barriers to control the flow of charge carriers through the active region 102. However, the traditional description of electrode/semiconductor Schottky and Ohmic barriers does not apply to a nanoscale memristor device 100 because the materials comprising the electrodes 104 and 106 and the active region 102 are structured at the nanoscale. As a result, the structural and electronic properties are not averaged over the large distances for which the theory of metal-semiconductor contacts is developed. Instead, the electronic properties of undoped electrode/active region interfaces can electronically resemble Schottky barriers and are called "Schottky-like barriers," and the electronic properties of doped electrode/active region interfaces electronically resemble Ohmic barriers and are called "Ohmic-like barriers."

Dopants are selectively positioned within the active region 102 to control the flow of charge carriers through the device. In particular, conduction of electrons from an electrode into the active region 102 occurs via quantum mechanical tunneling through the Ohmic-like barrier. FIG. 3A shows an electronic band diagram that represent the electronic properties of a Schottky-like barrier at an electrode 302/active region 304 interface 306 in accordance with embodiments of the present invention. FIG. 3A includes a band diagram 308 representing variations in valence and conduction bands associated with a Schottky-like barrier. When the active region 304 near the electrode 302 has a low dopant concentration or is essentially intrinsic, the tunneling barrier is a Schottky-like barrier 310, which can be characterized as high and wide, effectively preventing electrons from readily tunneling into the conduction band of the active region 304. Thus, the conductivity through the active region 304 is low and the memristor device 100 is said to be in an "off" state. On the other hand, FIG. 3B shows an electronic band diagram that represent the electronic properties of an Ohmic-like barrier at an electrode 312/active region 314 interface 316 in accordance with embodiments of the present invention. FIG. 3B includes a band diagram 318 representing variations in valence and conduction bands associated with an Ohmic-like barrier. Band diagram 318 represents the case where a sufficient number of dopants have been moved into the active region 314 near the electrode 312. As a result, the tunneling barrier is an Ohmic-like barrier 320 and the width and perhaps the height of the tunneling barrier are diminished such that electrons can tunnel from the electrode 312 into the conduction band of the active region 314, which results in an increase in the conductivity, and the device 100 is said to be in an "on" state.

Figure 4:
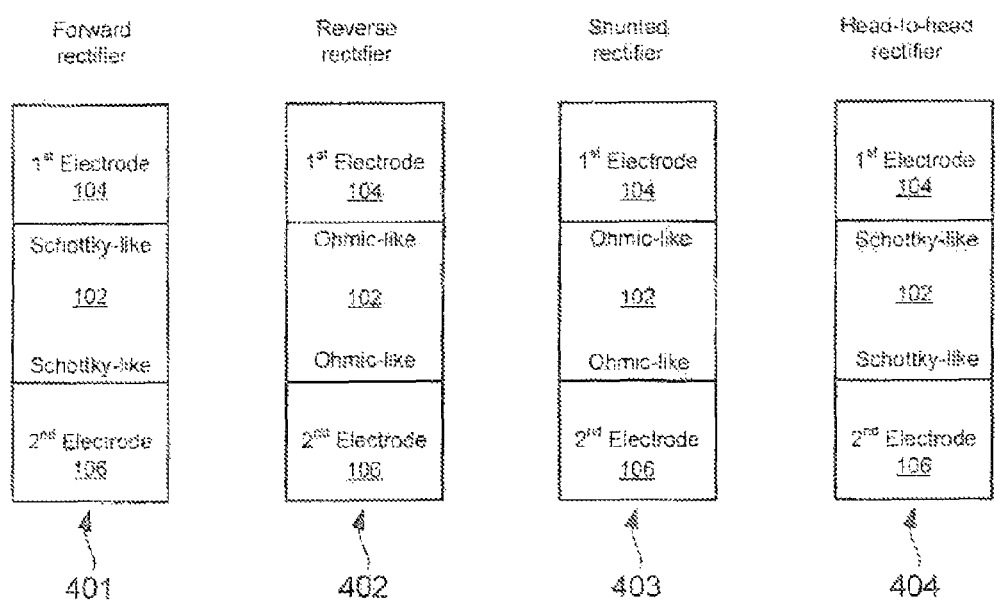
FIG. 4 shows relative locations of tunneling barriers for a homostructure active region operated in accordance with embodiments of the present invention.

Each of the four rectifiers corresponds to a different dopant distribution. FIG. 4 shows the relative locations of Ohmic-like and Schottky-like barriers associated with each of the four rectifiers in accordance with embodiments of the present invention. A forward rectifier 401 and a reverse rectifier 402 have Ohmic-like barriers and Schottky-like barriers located at opposite interfaces. A shunted rectifier 403 is characterized by having dopants located at or near both interfaces creating Ohmic-like barriers at both interfaces. On the other hand, a head-to-head rectifier 404 is characterized by having the dopants distributed within the active region 102 leaving Schottky-like barriers at both interfaces.

Figure 5:
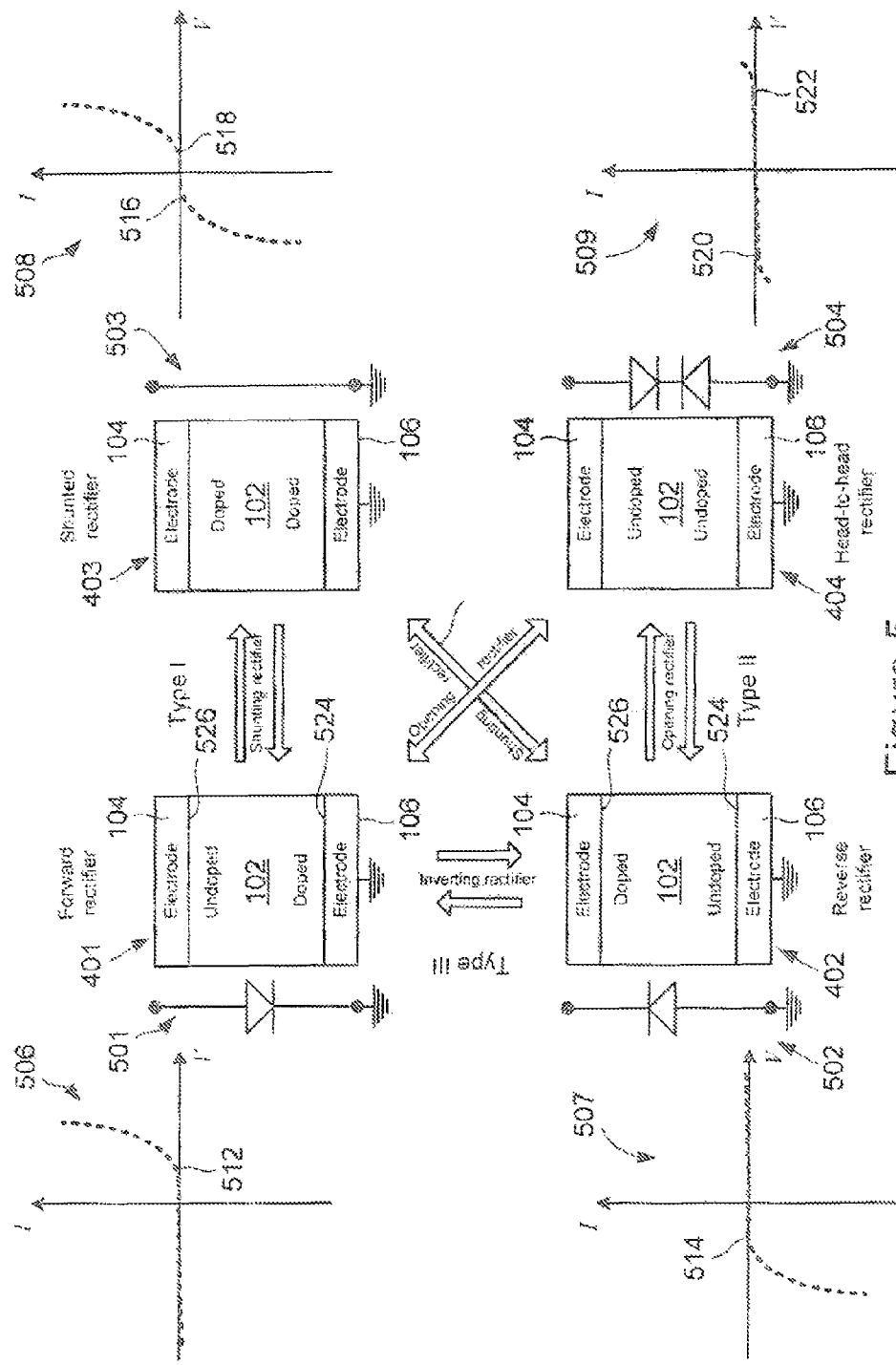
FIG. 5 shows schematic dopant profiles of four rectifiers and modes of switching between rectifiers in accordance with embodiments of the present invention.

FIG. 5 shows schematic dopant profiles of the four rectifiers 401-404 and three modes of switching between pairs of rectifiers in accordance with embodiments of the present invention. In addition to the four rectifiers 401-404, FIG. 5 includes circuit diagrams 501-504 and I-V characteristic plots 506-509 associated with each of the four rectifiers 401-404. Each of the four rectifiers 401-404 represents a different profile distribution of dopants, and therefore, has a different associated I-V characteristic represented in each of the plots 506-509. Electrode/active region contacts are typically Ohmic-like in the case of heavy doping, and rectifying or Schottky-like in the case of low doping. Thus, the concentration of dopants at an interface determines the electronic behavior, and therefore, the transport of charge carriers through the active region 102. The four different rectifiers 401-404 are also identified as a forward rectifier, a reverse rectifier, a shunted rectifier, and a head-to-head rectifier, respectively.

The plots 506-509 of the I-V characteristic curves reveal the response of the device 100 to different operating voltage polarities and magnitudes. In particular, plot 506 reveals that when the device 100 is configured as the forward rectifier 401, current flows from the first electrode 104 to the second electrode for positive polarity voltages exceeding a voltage 512 and resistance is large for negative polarity voltages. Plot 507 reveals that when the device 100 is configured as the reverse rectifier 402, current flows from the second electrode 106 to the first electrode 104 for negative polarity voltages exceeding a voltage 514 and resistance is large for positive polarity voltages. Plot 508 reveals that when the device 100 is configured as the shunted rectifier 406, current flows substantially undisturbed through the device 100 for positive and negative polarity voltages with magnitudes exceeding voltages 516 and 518. Finally, plot 509 reveals that when the device 100 is configured as a head-to-head rectifier 404, the resistance of the device 100 is high for positive and negative polarity voltages between voltages 520 and 522. Note that plots 506-509 show only operating voltage ranges. In other words, the magnitudes of voltages applied to the rectifiers 401-404 represented in plots 506-509 are not large enough to change the rectifier to a different rectifier or destroy the device 100.

The dopants are mobile under an appropriate drift field because the active region 102 may only be a few nanometers thick. The reconfiguration of the dopant profiles due to the drift of dopants under a drift field leads to electrical switching between the four rectifiers. As shown in FIG. 5, shunting is switching between the forward rectifier 401 and the shunted rectifier 403. In this switching, interface 524 is heavily doped and remains Ohmic-like with negligible changes during the electrical biasing. A bias with an appropriate polarity and magnitude on the first electrode 104 attracts a portion of the dopants to the interface 526, switching the device from the forward rectifier 401 to the shunted rectifier 403. A bias with an opposite polarity and approximately the same magnitude switches the shunted rectifier 403 back to the forward rectifier 401. Of course, the switching between the reverse rectifier 402 and the shunted rectifier 403 also belongs to this type of switching, as indicated by diagonal arrow 526.

Opening is switching between the reverse rectifier 402 and the head-to-head rectifier 404. In this case, the undoped interface 524 remains unchanged and only the doped interface 526 is switched. The undoped interface 524 contains few dopants and remains rectifying instead of Ohmic-like. A bias of an appropriate polarity and magnitude on the first electrode 104 forces dopants away from the interface 526 and switches the reverse rectifier 402 into the head-to-head rectifier 404, and vice versa. The switching between the forward rectifier 401 and the back-to-back rectifier 404 is also opening.

Inverting between the forward rectifier 401 and the reverse rectifier 402 involves simultaneously applying oppositely polarized biases to the electrodes 104 and 106. For example, switching from the forward rectifier 401 to the reverse rectifier 402 is accomplished by applying oppositely polarized biases to the electrodes 104 and 106 to force dopants away from the interface 524 and attract dopants to the interface 526. Switching from the reverse rectifier 402 to the forward rectifier 401 is accomplished by applying oppositely polarized biases to the electrodes 104 and 106 to force dopants away from the interface 526 and attract dopants to the interface 524. Therefore, the dopant profile across the active region 102 is essentially inverted and so is the rectifying orientation, resulting in a switching between a reverse rectifier and a forward rectifier.

Figure 6:
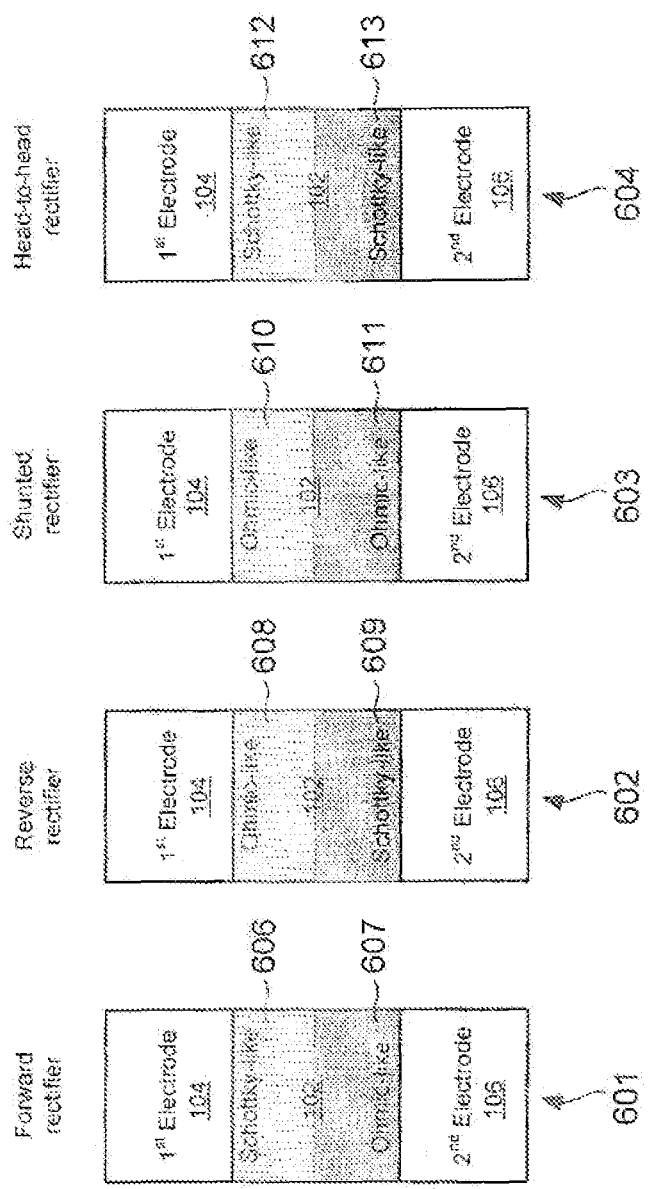
FIG. 6 shows relative locations of tunneling barriers for a heterostructure active region operated in accordance with embodiments of the present invention.

The large variety of semiconductor materials selected for heterostructure active regions and electrodes described above in subsection II provide for a large engineering space from which memristor devices can be fabricated. FIG. 6 shows the relative locations of the Ohmic-like and Schottky-like barriers associated with each of the four rectifiers 601-604 in a memristor device with a heterostructure active region configured in accordance with embodiments of the present invention. Lightly shaded region 606 represents a first semiconductor layer composed of first semiconductor material and darkly shaded region 607 represents a second semiconductor layer composed of a second semiconductor material. Unlike the rectifiers, described above with reference to FIG. 4, the different semiconductor materials have different Schottky-like and Ohmic-like barriers. For example, the Ohmic-like barrier 607 of the forward rectifier 601 may be higher and wider than the Ohmic-like barrier 608 of the reverse rectifier 602. The Schottky-like barrier 609 of the reverse rectifier 602 may be higher and wider than the Schottky-like barrier 606 of the forward rectifier 601. In addition, the Ohmic-like barrier 610 can be higher and wider than the Ohmic-like barrier 611. Finally, the two Schottky-like barriers 612 may higher and wider than the Schottky-like barrier 613.

Heterojunctions formed between different semiconductor layers of an active region can also affect the flow of charge carriers through a memristor device. The semiconductor materials forming a heterojunction have unequal band gaps, and the semiconductor materials can be selected to form different types of heterojunctions. FIG. 7 shows three band diagrams 701-703, each band diagram is associated with a different type of heterojunction formed between a first semiconductor layer and a second semiconductor layer. Note that the band diagrams 701-703 only represent conduction and valence band alignments and do not depict conduction and valence band changes at adjacent semiconductor interfaces. In band diagrams 701-703, $E_{c1}$, $E_{v1}$, and $E_{g1}$ represent the conduction band edge, the valence band edge, and band gap, respectively, for the first semiconductor, and $E_{c2}$, $E_{v2}$, and $E_{g2}$ represent the conduction band edge, the valence band edge, and band gap, respectively, for the second semiconductor. Band diagram 701 represents first and second semiconductors selected to form a heterojunction with a straddling band gap. In other words, the first semiconductor has a wider band gap than the second semiconductor, the valence band edge of the first semiconductor is lower in energy that the valence band edge of the second semiconductor, and the conduction band edge of the first semiconductor is higher in energy than the conduction band edge of second semiconductor. Band diagram 702 represents first and second semiconductors selected to form a heterojunction with a staggered band gap. Band diagram 702 is similar to band diagram 701, except the valence band edge of the second semiconductor is lower in energy than the valence band edge of the first semiconductor. Band diagram 703 represents first and second semiconductors selected to form a heterojunction with a broken band gap. In this case, the conduction band edge of the second semiconductor is lower in energy than the valence band edge of the first semiconductor.

Figure 8:
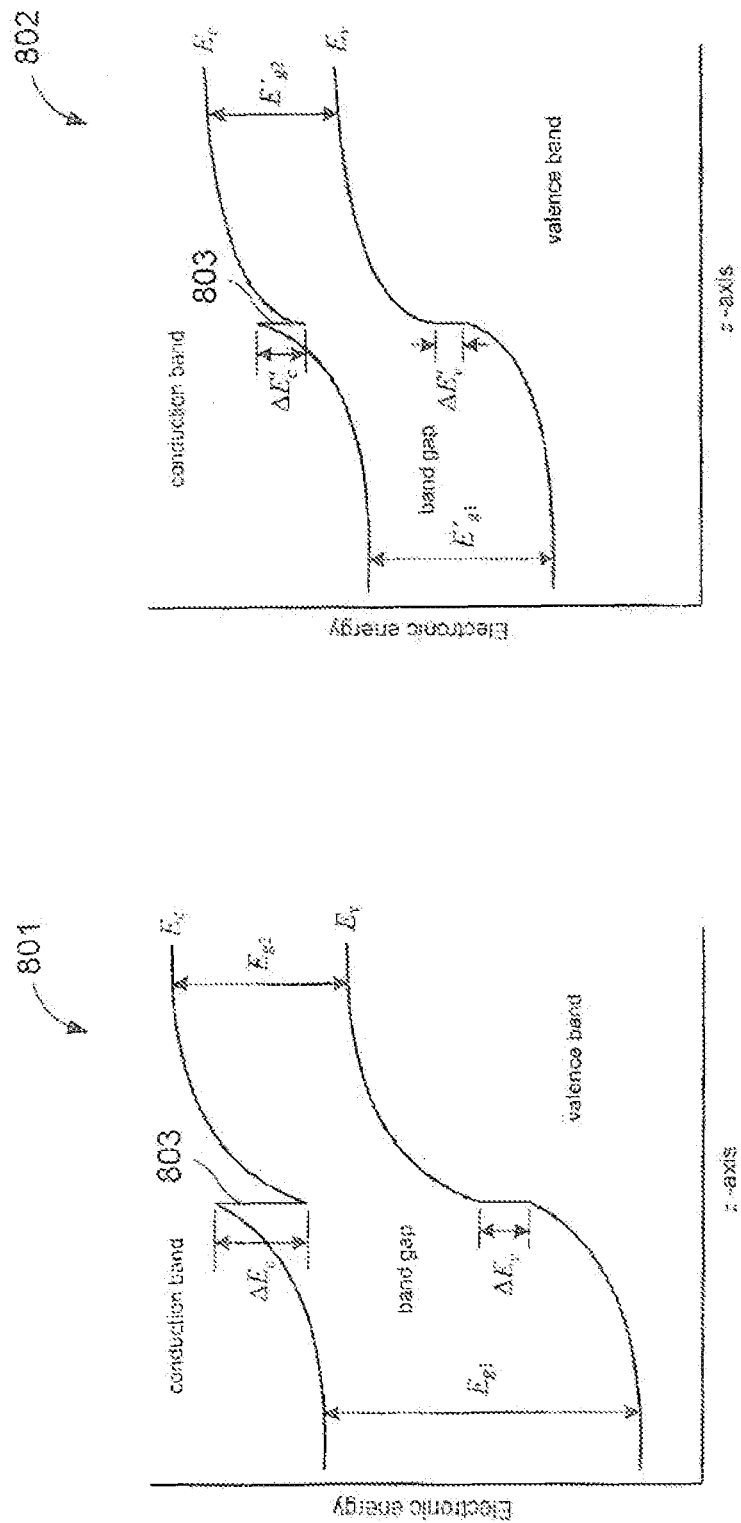
FIG. 8 shows band diagrams associated with a heterojunction of a memristor device operated in accordance with embodiments of the present invention.

The dopants can be moved into and out of heterojunctions in the active region to change the conductivity of the memristor device. FIG. 8 shows band diagrams 801 and 802 associated with a heterojunction of a memristor device operated in accordance with embodiments of the present invention. Band diagram 801 represents conduction band edges, valence band edges, and band gaps associated with a heterojunction formed between first and second semiconductors in an active region of a memristor device. The first semiconductor has a wider band gap than the second semiconductor, and the conduction and valence band edges of the first semiconductor are lower in energy that the conduction and valence band edges of the second semiconductor. Band diagram 801 also includes a conduction band offset, $\Delta E_c$, and a valence band offset, $\Delta E_v$, at the interface between the first and second semiconductors. Band diagram 801 also reveals an energy barrier 803 formed from a discontinuity in the conduction bands of the first and second semiconductors. The barrier 803 may be high and wide enough to prevent electrons from either tunneling or having sufficient kinetic energy to reach the conduction of the second semiconductor. On the hand, band diagram 802 represents conduction band edges, valence band edges, and band gaps associated with a heterojunction formed between the same two semiconductors in the active region when an n-type dopant drifts into the heterojunction. As shown in band diagram 802, the n-type dopant introduces filled electronic energy levels to the electronic band gap which changes the band gaps $E_{g1}$ and $E_{g2}$ to the smaller band gaps $E'_{g1}$ and $E'_{g2}$, respectively. The conduction and valence band offsets $\Delta E'_c$ and $\Delta E'_v$ are smaller than the conduction and valence band offsets $\Delta E_c$ and $\Delta E_v$ and the height of the barrier 803 is lowered. Thus, electrons are more likely to tunnel through the barrier 803 or have sufficient energy to overcome the relatively lower barrier 803 height.

B. Bulk Switching

Figure 9:
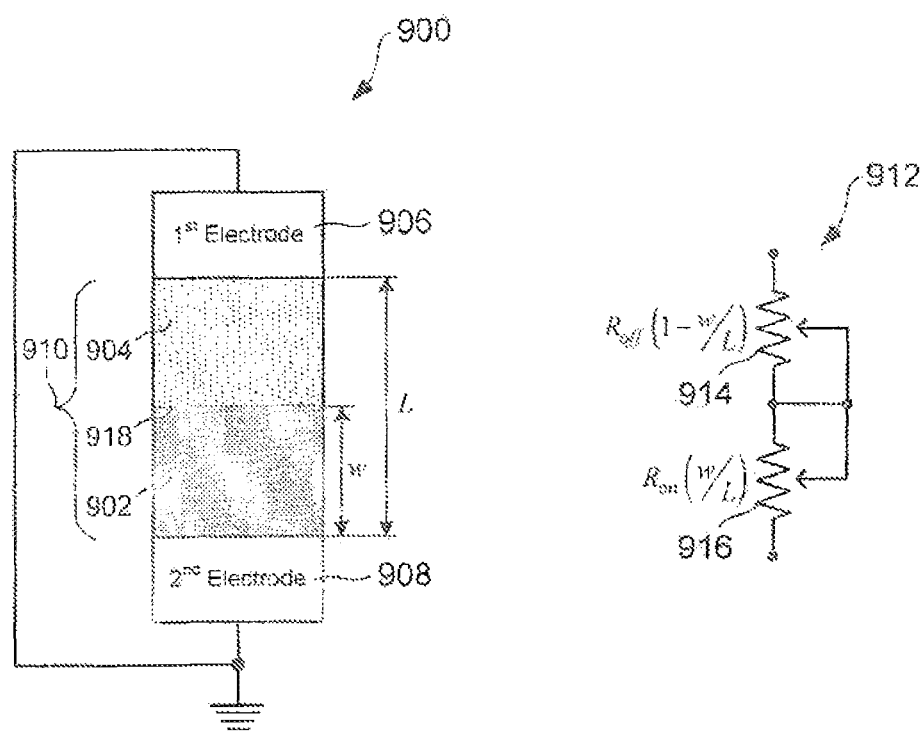
FIG. 9 shows a schematic representation of a memristor device used in bulk switching in accordance with embodiments of the present invention.

Unlike interface switching, in bulk switching, there is no or relatively little electronic barrier at the active region/electrode interface. In other words, interface resistance is negligible and bulk resistance dominates. Embodiments of the present invention include selecting the semiconductor and dopant materials for the active region in order to form an active resistor with two sub-regions, each sub-region having a different resistance in series. FIG. 9 shows a schematic representation of a memristor device 900 used in bulk switching in accordance with embodiments of the present invention. The device 900 includes a doped semiconductor region 902 and a substantially undoped semiconductor region 904. The regions 902 and 904 are sandwiched between a first electrode 906 and a second electrode 908 and form an active region 910 that can be composed of a single semiconductor or a combination of two or more semiconductor layers, as described above in subsection II. The thickness of the active region 910 is denoted by L and w is a state variable that specifies the distribution of dopants in the active region 910. It is proposed that resistance switching and charge transport within the device 900 is a hysteresis requiring an atomic rearrangement of dopants with the active region 910 that modulates the electronic current. The total resistance of the device 900 is determined by two variable resistors connected in series, where the resistances are given for the full length L of the device 900. In particular, the doped region 902 has a relatively low resistance $R_{on}$, and because the region 904 has a low or substantially zero dopant concentration, the region 904 has a relatively higher resistance $R_{off}$. FIG. 9 also includes a circuit diagram 912 with a first resistor 914 and a second resistor 916 in series. First resistor 914 represents the substantially undoped region 904 and has a relatively higher resistance than the second resistor 916 representing the doped region 902.

Application of an external bias voltage v(t) across the device 900 moves the boundary 918 between the two regions 902 and 904 by causing the charged dopants to drift into the undoped region 904. For example, in the case of Ohmic electronic conduction and linear ionic drift in a uniform field with average ion mobility $\mu_v$ gives:

$$v(t) = \left(R_{on}\frac{w(t)}{L} + R_{off}\left(1 - \frac{w(t)}{L}\right)\right)i(t)$$

and $$\frac{dw(t)}{dt} = \mu_V \frac{R_{on}}{L} i(t)$$

which yields the following:

$$w(t) = \mu_V \frac{R_{on}}{L} q(t)$$

where w ranges from 0 to L. Substituting w(t) into v(t) and taking $R_{on} \square R_{off}$ gives:

$$M(q) = R_{off}\left(1 - \frac{\mu R_{on}}{L^2} q(t)\right)$$

The time-dependent charge q(t) is the contribution to the memristance and it becomes larger in absolute value for relatively higher dopant mobilities $\mu_v$ and smaller L. In particular, for any material, q (t) pre-factor is approximately 1,000,000 times larger in absolute value at the nanometer scale, because of the factor $1/L^2$, and the memristance is correspondingly more significant. Thus, memristance becomes more important for understanding the electronic characteristics of any device 900 as the dimensions shrink to the nanometer scale.

Figures 10, 11:
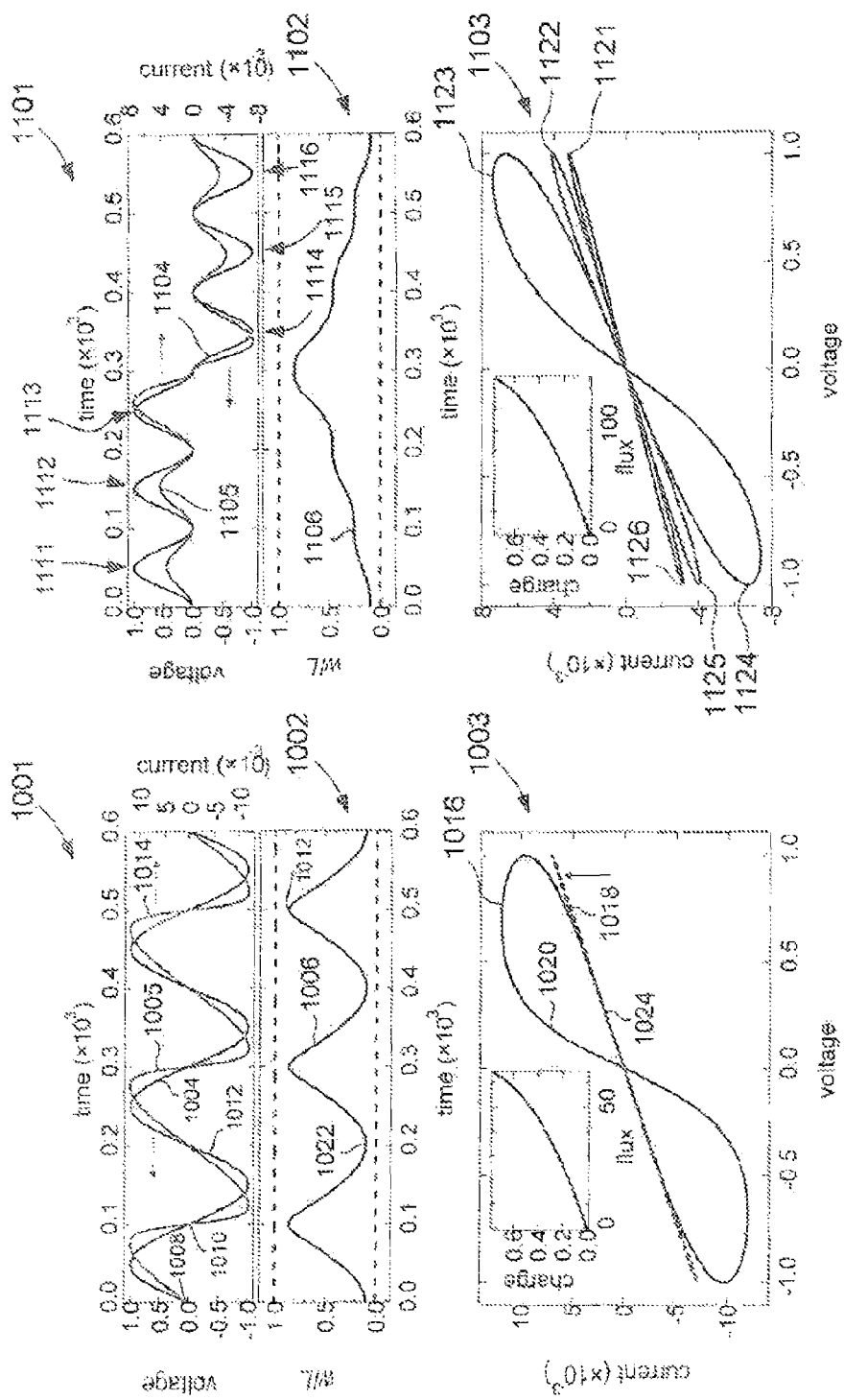
FIG. 10 shows plots of a first applied voltage, resulting current, and I-V hysteresis for the memristor device shown in FIG. 9 in accordance with embodiments of the present invention.
FIG. 11 shows plots of a second applied voltage, resulting current, and I-V hysteresis for the memristor device shown in FIG. 9 in accordance with embodiments of the present invention.

The state variable w is proportional to the charge q that passes through the device 900 until its value approaches L. This is the condition of "hard" switching characterized by large voltage excursions or long times under bias voltage. FIG. 10 shows a first plot 1001 of an applied voltage and resulting current versus time, a second plot 1002 of the ratio of w/L versus time, and a plot 1003 of I-V hysteresis for the device 900. In plot 1001, an applied voltage curve 1004, representing $v_0 \sin(\omega_0 t)$, represents an oscillating bias voltage applied the device 900 where $v_0$ is the magnitude of the applied bias voltage and $\omega_0$ is the frequency, and curve 1005 represents the resulting current flowing through the device 900 with a resistance ratio $R_{on}/R_{off}=160$. In plots 1001-1003, the axes are dimensionless, with voltage, current, time, flux, and charge expressed in units of $v_0=1V$, $i_0=v_0/R_{on}=10$ mA, $t_0=2\pi/\omega_0=L^2/\mu_v v_0=10$ ms, where $i_0$ denotes the maximum possible current through the device 900, and $t_0$ is the shortest time required for linear drift of dopants across the full device 900 length in a uniform field $v_0/L$, for example with L=10 nm and $\mu_v=10^{-10}$ cm$^2$s$^{-1}$V$^{-1}$.

Plots 1001 and 1002 reveal how the ratio w/L 1006 and the resulting current 1005 flowing through the device 900 respond to the oscillating applied bias voltage 1004. For example, while the applied voltage is positive, such as between point 1008 and 1010, w/L curve 1006 reveals that w increases. In other words, the doped region 902 expands because an electric field associated with the applied voltage causes dopants to drift into the shrinking undoped region 904. In contrast, when the polarity of the applied voltage reverses between point 1010 and 1012, the doped region 902 retracts because the field associated with the reverse polarity causes dopants to drift in the opposite direction expanding the undoped region 904. Curves 1005 and 1006 reveal how the amplitude of the current flowing through the device 900 changes with w. For example, current curve 1005 reveals that the resulting current approaches a maximum amplitude (negative or positive), such as point 1014, when w approaches a maximum, as indicated by point 1012, and the current goes to zero when w approaches a minimum, as indicated by point 1014. Note that, for the parameters selected, the applied bias never forces either of the two resistive regions to collapse. For example, curve 1006 shows that w/L does not approach zero or one. Plot 1003 shows two I-V hysteresis curves 1016 and 1018. Relatively steep positively sloped portion 1020 of curve 1016 corresponds to minima, such as minimum 1022, of x/L curve 1006, and gentle, positively sloped portion 1024 corresponds to maxima, such as maximum 1012, of x/L curve 1006. As long as the device 800 remains in the memristor regime, any symmetrical alternating-current voltage bias results in double-loop I-V hysteresis that collapses to a straight line for high frequencies. In particular, the collapsed I-V hysteresis identified by straight line 1018 is observed for a 10 fold increase in the frequency of the applied bias voltage.

FIG. 11 shows a first plot 1101 of an applied voltage and resulting current versus time, a second plot 1102 of the ratio of w/L versus time, and a plot 1103 of I-V hysteresis for the device 900. In plot 1101, an applied voltage curve 1104 is $\pm v_0 \sin^2(\omega_0 t)$, and curve 1005 represents the resulting current flowing through the device 900 with a resistance ratio $R_{on}/R_{off}=380$. The axes are also dimensionless with voltage, current, time, flux, and charge characterized as described above with reference to FIG. 10. Curve 1106 represents the ratio of wIL associated with curves 1104 and 1105. Successive waves 1111-1116 correspond to loops 1121-1126 of I-V hysteresis curves, shown in plot 1103, indicate that multiple continuous states are obtained when there is any sort of asymmetry in the applied bias.

IV. Nanowire Implementations

Figure 12:
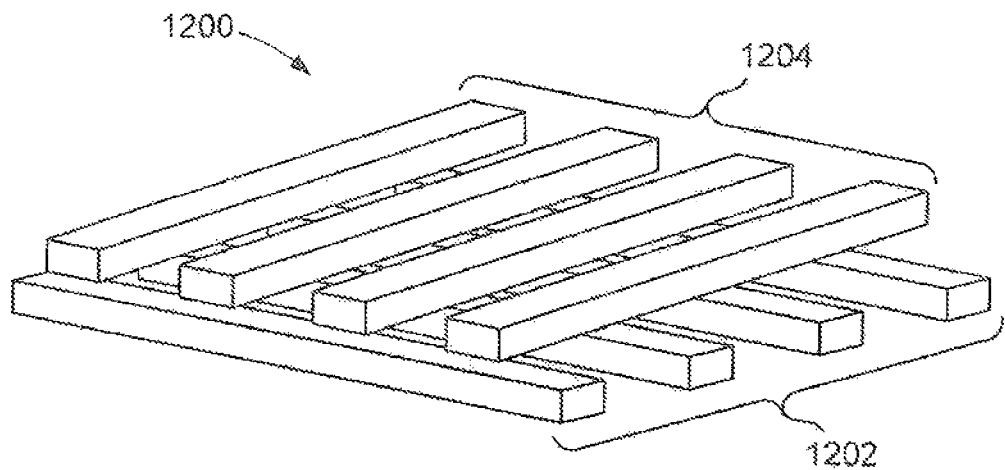
FIG. 12 shows an isometric view of a nanowire crossbar array configured in accordance with embodiments of the present invention.

The memristor devices described above in subsections II and III can be implemented at nanowire intersections of nanowire crossbar arrays. FIG. 12 shows an isometric view of a nanowire crossbar array 1200 configured in accordance with embodiments of the present invention. The crossbar array 1200 is composed of a first layer of approximately parallel nanowires 1202 that are overlain by a second layer of approximately parallel nanowires 1204. The nanowires of the second layer 1204 are approximately perpendicular, in orientation, to the nanowires of the first layer 1202, although the orientation angle between the layers may vary. The two layers of nanowires form a lattice, or crossbar, each nanowire of the second layer 1204 overlying all of the nanowires of the first layer 1202 and coming into close contact with each nanowire of the first layer 1202 at nanowire intersections that represent the closest contact between two nanowires.

Although individual nanowires in FIG. 12 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires. The layers can be fabricated by mechanical nanoimprinting techniques, photolithography, and electron beam lithography. Alternatively, nanowires can be chemically synthesized and can be deposited as layers of approximately parallel nanowires in one or more processing steps, including Langmuir-Blodgett processes. Other alternative techniques for fabricating nanowires may also be employed. Thus, a two-layer nanowire crossbar comprising first and second layers, as shown in FIG. 12, can be manufactured by any of numerous relatively straightforward processes. Many different types of conductive and semiconductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits. At nanowire intersections, nanoscale electronic components, such as resistors, and other familiar basic electronic components, can be fabricated to interconnect two overlapping nanowires. Any two nanowires connected by a device is called a "crossbar junction."

Figure 13:
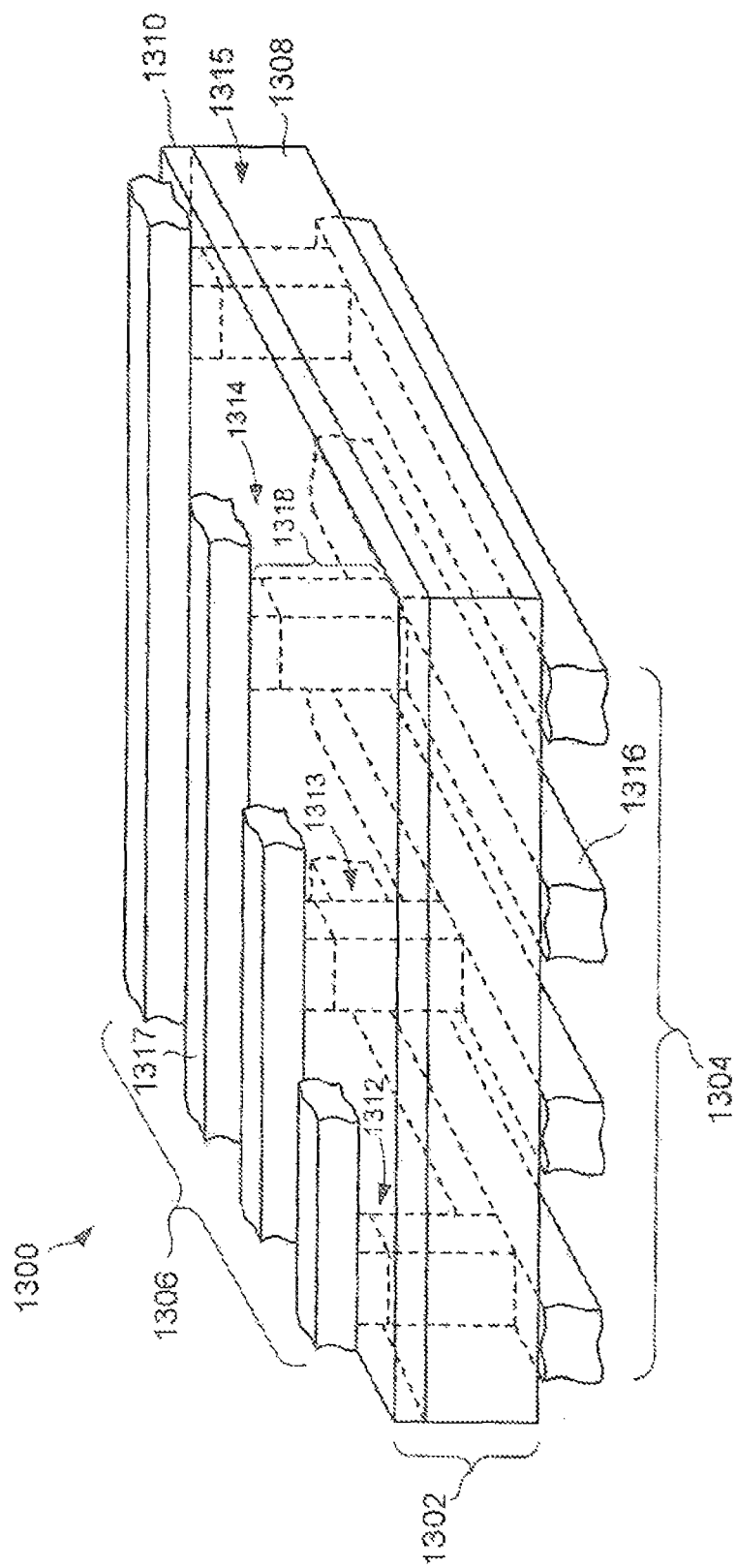
FIG. 13 shows an isometric view of a nanowire crossbar revealing devices located at intersection of a crossbar configured in accordance with embodiments of the present invention.

FIG. 13 shows an isometric view of a nanowire crossbar 1300 revealing an intermediate layer 1302 disposed between a first layer of approximately parallel nanowires 1304 and a second layer of approximately parallel nanowires 1306 in accordance with embodiments of the present invention. The layer 1302 is composed of sub-layers 1308 and 1310. The sub-layer 1308 can be composed of an undoped primary active material, and the sub-layer 1310 can be composed of a doped secondary active material, respectively. The material comprising the layer 1302 and dopants are selected as described in subsection II to form devices 1312-1315 at each nanowire intersection. The nanowires can be composed of suitable metals or semiconductor materials and serve as electrodes. The device 1314 comprises a nanowire 1316 in the first layer 1304, a nanowire 1317 in the second layer 1306, and a region 1318 within the layer 1302 between the nanowires 1316 and 1317. Each of the devices 1312-1315 can be operated separately to produce the forward, reverse, shunted, and head-to-head rectifiers described above with reference to FIGS. 4 and 6.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memristor device comprising:
an active region sandwiched between a first electrode and a second electrode, the active region comprising a semiconductor layer and a dopant within the semiconductor layer, the dopant to be selectively positioned within the active region to control the flow of charge carriers through the memristor device.

2. The device of claim 1 wherein the dopant is to be selectively positioned adjacent to one or both of the first electrode and the second electrode at an electrode/active region interface to form an Ohmic-like barrier.

3. The device of claim 1 wherein the dopant is to be selectively positioned away from one or both of the first electrode and the second electrodes outside of an electrode/active region interface to form a Schottky-like barrier.

4. The device of claim 1 wherein the dopant is to be selectively positioned to form a nonvolatile rectifier.

5. The device of claim 1 wherein the dopant is to be selectively distributed within the active region to control the resistance of the memristor device.

6. The device of claim 1 wherein the semiconductor layer comprises a semiconductor selected from a group consisting of elemental semiconductors, group IV compound semiconductors, III-V compound semiconductors, II-VI compound semiconductors, II-VI ternary alloy semiconductors, IV-VI compound semiconductors, II-V compound semiconductors, semiconducting nitrides, and semiconducting halides and mixtures of various combinations of elemental and compound semiconductors.

7. The device of claim 1 wherein the dopant is selected from a group consisting of aliovalent elements, anion vacancy, p-type impurities, and n-type impurities.

8. The device of claim 1 wherein the first electrode and the second electrode are selected from a group consisting of platinum, gold, copper, tungsten, or any other suitable metal, metallic compound or semiconductor.

9. The device of claim 1 wherein the active region further comprises:
a primary active region comprising a first portion of the semiconductor layer, the primary active region to control the flow of charge carriers through the device according to the selectively positioned dopant; and
a secondary active region comprising a second portion of the semiconductor layer, the secondary active region to serve as a source/sink of the dopant.

10. The device of claim 9 wherein the primary active region is to be reversibly changed from a relatively low conductivity to a relatively high conductivity as a function of the dopant drifting into or out of the primary active region.

11. The device of claim 1 wherein the dopant is to be selectively positioned by applying an electric field of an appropriate magnitude and polarity across the active region.

12. The device of claim 1 wherein the semiconductor layer comprises a plurality of semiconductor layers to provide one or more heterojunctions to be selectively and electronically configured to control the flow of charge carriers through the device by the dopant being selectively positioned substantially within the one or more heterojunctions.

13. A crossbar comprising:
a first layer of substantially parallel nanowires;
a second layer of substantially parallel nanowires overlaying the first layer of nanowires; and
at least one nanowire intersection forming a memristor device configured in accordance with claim 1.

14. The crossbar of claim 13 wherein the first layer of nanowires further comprise a first metal and the second layer of nanowires further comprise a second metal.

15. The crossbar of claim 13 wherein the first layer of nanowires further comprises a semiconductor and the second layer of nanowires further comprises a metal.

16. A memristor device comprising:
a first electrode;
a second electrode; and
an active region sandwiched between the first electrode and the second electrode, the active region comprising a semiconductor layer and a dopant within the semiconductor layer, the dopant to be selectively positioned within the active region to control the flow of charge carriers through the memristor device,
wherein the dopant is to be selectively positioned to form a nonvolatile rectifier.

17. A memristor device comprising:
a first electrode;
a second electrode; and
an active region sandwiched between the first electrode and the second electrode, the active region comprising a semiconductor layer and a dopant within the semiconductor layer, the dopant to be selectively positioned within the active region to control the flow of charge carriers through the memristor device,
wherein the semiconductor layer comprises a plurality of semiconductor layers to provide a heterojunction, the heterojunction to be selectively and electronically configured to control the flow of charge carriers through the device by the dopant being selectively positioned substantially within the heterojunction.

* * * * *